United States Patent [19]

Hennion

[11] Patent Number: 4,791,593
[45] Date of Patent: Dec. 13, 1988

[54] SYSTEM FOR THE SIMULATION OF AN ELECTRONIC CIRCUIT

[76] Inventor: Bernard Hennion, les Bonnets 38610, St. Martin d'Uriage, France

[21] Appl. No.: 836,437

[22] Filed: Mar. 5, 1986

[30] Foreign Application Priority Data

Mar. 8, 1985 [FR] France ............................ 85 03429

[51] Int. Cl.[4] ...................... G06F 15/31; G06F 15/60; G06G 7/62
[52] U.S. Cl. .................................... 364/578; 364/488
[58] Field of Search ................ 364/490, 578, 488, 489

[56] References Cited

FOREIGN PATENT DOCUMENTS

WO85/4739 10/1985 European Pat. Off. ............ 364/578
1445914 8/1976 United Kingdom ................. 364/490

OTHER PUBLICATIONS

House: Development System Lays Basis for Fully Integrated VLSI Design Center, Electronics, 2/28/80, vol. 53, No. 5, pp. 143–147.
Barto et al.: A Computer Architecture for Digital Logic Simulation, Electronic Engineering, Sep. 1980, vol. 52, No. 642, pp. 35, 36, 41, 45, 47, 50, 52, 56, 60, 63, 66.
Proceedings of the IEEE, Oct. 1981, vol. 69, No. 10, pp. 1264–1280, Hachtel et. al.: A Survey of Third-Generation Simulation Techniques.
IEEE Transactions on Circuits and Systems, Sep. 1979, Rabbat et al., A Multilevel Newton Algorithm and Latency for the Analysis of Large-Scale Nonlinear Circuits, CAS-26, pp. 733–740.
IEEE Transactions on Circuits and Systems, Sep. 1979, Newton, Techniques for the Simulation of Large-Scale Integrated Circuits, pp. 741–749.

Primary Examiner—Felix D. Gruber
Attorney, Agent, or Firm—Pearne, Gordon, McCoy & Granger

[57] ABSTRACT

A simulation system of an electronic circuit. The system comprises a memory, a processor, an interface circuit and data, address and control buses connecting these components. The memory has a first zone containing data for representing the simulated electronic circuit, a second zone containing instructions and a third calculating zone. The state of the electronic circuit is determined by the electrical potential in each node. The processor performs the instructions contained in the second memory zone. The processor is able to calculated the potential of all the nodes at a fixed time $T_n$, $1 \leq n \leq N$ by solving for each node an implicit equation relative to the potential of said node, the calculation being successively repeated for the times $T_1, T_2 \ldots T_N$.

6 Claims, 7 Drawing Sheets

SYSTEM FOR THE SIMULATION OF AN ELECTRONIC CIRCUIT

BACKGROUND OF THE INVENTION

The present invention relates to a system for simulating an electronic circuit making it possible to simulate the electrical behaviour in time of a given electronic circuit subject to given electrical operating conditions.

Conventionally, the simulated electronic circuit is described as being a network having a certain number of nodes and branches, each having one or more components of the resistor, capacitor, inductor, transistor or similar type. This is followed by the definition of the electrical supply conditions of this electronic circuit, as well as the shape of the electrical control signal or signals applied to one or several inputs of said circuit.

Thus, a simulation system receives a first sequence of coded electrical signals representing the description of the electrical circuit, i.e. indicating the nodes of the network, the branches connecting two of these nodes in each case and the components of each branch, a second sequence of coded electrical signals representing the electrical operating conditions of the circuit, a third sequence of coded electrical signals representing the function existing between the voltage applied to the terminals of each of the circuit components (resistor, capacitor, inductor, transistor, etc) or time derivative and the current flowing through said component, as well as a fourth sequence of coded electrical signals indicating the nodes for which it is necessary to carry out the simulation of the electrical state at a given time t, together with the determination of the time interval $\Delta t$ for the following simulation performed at time $t+\Delta t$, the electrical signals of said sequences being in general binary signals.

The simulation systems make it possible to evaluate the probable performances of an electronic circuit without it being necessary to physically realize said circuit. They also make it possible to rapidly test different embodiments of a circuit being developed. Therefore simulation systems are used for the development of electronic circuits.

Each simulation system is essentially defined by two parameters, namely the system of differential equations used for modeling the electronic circuit and the method used for solving this system of differential equations. Among the most widely used representations, reference can be made to the Euler, trapezium and GEAR models. For each of these models, it is possible to choose as a function of the simulated electronic circuit type and the desired accuracy of calculating the potentials of the nodes, models of order 1, order 2 or a higher order, i.e. respectively only taken account of the first derivative of the potential, the first two derivatives of the potential or higher order derivatives.

The model chosen to represent an electronic circuit does not generally constitute a characteristic of the simulation system. However, the choice of a resolution method for the model is a characteristic of a simulation system and defines its performance and capacity.

Electronic circuit simulation systems are generally placed in three generations, each defined by the method used for solving the system of differential equations representing said electronic circuit. The first generation corresponds to the first simulation systems developed in the 1960's. The simulation systems developed in the 1970's roughly correspond to the second generation. A first example of such a simulation system is described in the article: "SPICE 2: a computer program to simulate semiconductor circuits", by L. N. Nagel, University of California, Berkeley, May 1975.

In this simulation system, the system of differential equations representing the electronic circuit is solved by the Newton method. This method uses Jacobian computations to solve the system of differential equations, said Jacobian being a matrix of $p \times p$ elements for an electronic circuit with p nodes, and inverse of Jacobian computations. The potential of each node of the electronic circuit is then directly obtained by means of the inverse of the Jacobian matrix.

The inversion of the Jacobian matrix represents a considerable calculation volume. It should be noted that this volume increases with the square of the size of the simulated circuit, which in practice limits the use of this simulation system to electronic circuits not exceeding roughly 50 transistors, because for more complex electronic circuits the calculation time becomes prohibitive.

The article "MOTIS—A MOS timing simulator" by B. R. Chawla, H. K. Gummel and P. Kozak, which appeared in IEEE transactions, vol CAS-22, No 12, pp 901–910, December 1975 describes another second generation simulation system which does not use the Newton method. One of the characteristics of this simulation system consists of ignoring the coupling between some nodes and in particular the weak back couplings.

This makes it possible to simplify the system of differential equations modeling the simulated electronic circuit and consequently reduce the volume of the calculations making it possible to obtain the potentials of the nodes. As a result of ignoring some couplings the disadvantage is encountered of reducing the accuracy over the calculated potentials to about 10%, and of restricting the use of this simulation system to logic circuits, i.e. circuits not having back couplings.

A second characteristic of this simulation system is the sequencing of the nodes, which consists of classifying the nodes in the order in which they receive an electrical signal propagating in the simulated electronic circuit and calculating the potentials of the nodes of the circuit in this order. This sequencing is necessary due to the approximation caused by eliminating the weak couplings.

Finally a third generation simulation system is known in which the potential of each node is determined by an iterative calculation on each equation of the differential equation system. This simulation system is more particularly described in the articles "The Waveform Relaxation Method for time domain analysis of large scale integrated circuits" by E. LELARASME, A. E. RUEHLI and A. SANGIOVANNI-VINCENTELLI, which appeared in IEEE Transactions of CAD, vol CAD-1, No 3, July 1982, pp 131-145 and "RELAX a new circuit simulator for large scale MOS integrated circuits" by E. LELARASME and A. SANGIOVANNI-VINCENTELLI published at the 19th DAC conference in 1982.

The resolution method used in this simulation system is called the waveform relaxation method or WRM, by reference to successive iterations performed in order to obtain the potential in one node of the circuit.

Before describing the operation of this known simulation system with respect to the flow chart of FIG. 1, a definition will be provided of the notations used in the remainder of the description for representing the simulated electronic circuit.

The state of this electronic circuit can be represented by the implicit differential equation $F(t, V, \dot{V}, \ddot{V}, \ldots) = 0$, in which t is time, $V = (^1v, {}^2v, \ldots {}^pv)$ represents the potentials of each of the p nodes of the circuit, $\dot{V}$ is the first derivative of V and $\ddot{V}$ is the second derivative of V.

Equation $F(t, \dot{V}, \ddot{V}, \ldots) = 0$ is a group of p differential equations and the order of this equation is generally between 1 and 6. Solving this equation for a time t determines the potentials $(^jv)_{1 \leq j \leq p}$ of the nodes of the electronic circuit at this time.

Throughout the remainder of the description, index n which is between 1 and N designates the successive calculating times of the electronic circuit state, the index i indicates the relaxation iteration number during the calculation of the potential of a node and index j, between 1 and p, designates one of the nodes in an electronic circuit with p nodes. On the basis of these notations, the value of the potential of node j at time n obtained in the ith iteration is designated $^jv_n^i$.

The flow chart of FIG. 1 illustrates the processing performed by the known WRM simulation system for calculating the potential in each node of a simulated electronic circuit.

This processing comprises a sequence of interrogations (or propositions), whose content is descrbed in a diamond shaped box with one input and two outputs, one being used in the case of an affirmative answer, the other in the case of a negative answer and a sequence of operations, whose content is described in a rectangle with one input and one output. Each of these propositions and operations is designated by a numerical reference. The flow chart also has a begin declaration designated 2 and an end declaration designated 36.

The operations performed are as follows:
4: initialization of the iteration index i at value 1,
6: initialization of the node index j at value 1,
8: initialization of the time index n at value 1,
10. solving the equation $^jE(^jv_n^i) = 0$, calculation of $^je_n^i = |^jv_n^i - {}^jv_n^{i-1}|$, and storage of $^jv_n^i$ and $^je_n^i$,
14: allocation of the value $^je_1^i$ to the variable $^je^i$,
16: allocation of the maximum value between $^je_n^i$ and $^je^i$ to the variable $^je^i$,
20: incrementation of the time index n,
24: allocation of the value $^1e^i$ to the variable $d^i$,
26: allocation of the maximum value between $^je^i$ and $d^i$ to the variable $d^i$,
30: incrementation of the index of node j,
34: incrementation of the iteration index i.

The interrogations or propositions are as follows:
12: time index n equal to 1,
18: time index n equal to N,
22: node index j equal to 1,
28: node index j equal to p,
32: $d^i$ below a given threshold value $\delta$.

The calculation of the potential in each node of a simulated electronic circuit takes place, according to the flow chart of FIG. 1, in the following way. Firstly the iteration index i and node index j are initialized at 1. The resolution process than consists of calculating, for each time $T_n, 1 \leq n \leq N$, a first value of the potential of the first node. This is obtained by solving the implicit differential equation $^1E(^1v_n^1) = 0$, deduced from the first component of the vector differential equation $F(t, V, \dot{V}, \ldots) = 0$, for each time $\tau_n$ (operation 19). This operation is then repeated for each of the p nodes. At the end of the first iteration, $p \times N$ potential values have been stored. These values constitute a first approximation of the potential of each node at each time. By successive iterations, these $p \times N$ potential values can be refined.

This iteration takes place up to the convergence of each of the $p \times N$ sequences $(^jv_n^1, {}^jv_n^2, {}^jv_n^3, \ldots)$, in which $1 \leq j \leq p$ and $1 \leq n \leq N$. To establish whether convergence exists, for each node j and for each time $T_n$, calculation takes place of an error term $^je_n^i$ equal to $|^jv_n^i - {}^jv_n^{i-1}|$ (operation 10).

This method for calculating the potential in each node and at each time of a simulated electronic circuit calls for at least two comments. Firstly the real value of the potential in a random node and at a random time in only known at the end of processing. Secondly, this method makes it necessary to store at least $p \times N$ potential values constituting the result of an iteration, but also $p \times N$ potential values calculated during the preceding iteration, in order to check whether each of the $p \times N$ sequences of potentials converge. Thus, this processing method requires a data memory containing at least $2 \times p \times N$ potential values. It is also pointed out that even if a single sequence does not converge, a new iteration is performed for each of the $p \times N$ sequences, which can lead to the needless recalculation of potential values, whose associated sequences are already convergent.

The number of times N where the potential is calculated can exceed 1000, so that this resolution method requires a very large memory of approximately 1 Mbyte for an electronic circuit having roughly 50 transistors.

SUMMARY OF THE INVENTION

The object of the present invention is a simulation system more particularly making it possible to simulate much more complex electronic circuits than those which can be simulated by known simulation systems. The invention also aims at increasing the speed of calculating the potential in each node.

These objectives are achieved through the use of an original resolution method consisting essentially of fixing a time T, in which $1 \leq n \leq N$, and calculating for this time the potential of each of the p nodes of the simulated circuit, said calculation then being repeated for each of the times $T_1, T_2, \ldots T_N$.

More specifically, the present invention relates to a simulation system of an electronic circuit comprising a memory, a processor, an interface circuit and data, address and control buses connecting said components, said memory having a first zone containing data for representing the simulated electronic circuit, a second zone containing instructions and a third calculating zone, said electronic circuit being represented by a network having nodes and branches, each branch having at least one electrical component, the state of said electronic circuit being determined by the electrical potential in each node, the processor performing the instructions contained in said second memory zone, wherein the processor is able to calculate the potential of all the nodes at a fixed time $T_n$, $1 \leq n \leq N$ by solving for each node an implicit equation relative to the potential of said node, said calculation being successively repeated for all the times $T_1, T_2, \ldots T_N$. The calculated results at times $T_1, T_2 \ldots T_N$ are then displayed and used to design an actual circuit.

Thus, the method used in the system according to the invention makes it possible to calculate the potential of all the nodes at a given time and then the potential of all the nodes at a following time and so on. In this way, it is no longer necessary to store all the calculated potential values, as in the WRM method.

This leads to a very significant memory space gain making it possible to simulate electronic circuits with a comlexity of 1000 or more transistors. This also makes it possible to supply potential values without waiting for the end of the simulation, because the calculation of the potential values corresponding to the x first times $1 \leq x \leq N$ is terminated after a time $(x/n)T$, in which T is the total duration of the simulation.

In preferred manner, the processor of the simulation system according to the invention calculates for each fixed time $T_n$, in which $1 \leq n \leq N$, the potential of each node by an iterative method.

Generally speaking, when the potential of a node is calculated by an iterative method, the potential value is obtained through a few iterations. However, in the case of some specific circuits, and particularly bipolar circuits, the number of iterations to be done to obtain a potential value may be quite large.

In such a case, it is advantageous to speed up the convergence of the sequence of potential values $^jv_n^1$, $^jv_n^2, \ldots, ^jv_n^i$, where i is the relaxation iteration number, to use as start potential value in an iteration a linear combination of the potential values obtained at the last two iterations instead of using as start value the potential value obtained at the last iteration. That is, for iteration $i_0$, the start value is $\lambda ^jv_n^{io-1}+(1-\lambda)^jv_n^{io-2}$ instead of $^jv_n^{io-1}$.

Coefficient $\lambda$ is chosen according to the sequence $^jv_n^1, \ldots ^jv_n^{io-1}$. If this sequence is monotonic, i.e. decreasing or increasing, $\lambda$ is chosen greater than 1 (over-relaxation) so that convergence of the sequence is speed up by anticipating the variation of the sequence. If the sequence is an oscillatory one, $\lambda$ is chosen less than 1 (under-relaxation) so that convergence of the sequence is speed up by smoothing the oscillations of the sequence.

In some cases, the using of over- or under-relaxation makes it possible to divide by 3 the number of relaxation iterations, and therefore the processing time in the same ratio.

For solving the implicit equation relative to the potential of a node, the processor may be use the fixed-point algorithm followed by the secant method.

This known method obviates the need for any derivation of the implicit equation describing the state of the simulated electronic circuit. Compared with the Newton method, generally used in known simulation systems and which calculates the derivative of the implicit equation, a significant amount of calculating time is saved.

Advantageously, the simulation system is characterized in that for each fixed time $T_n$, in which $1 \leq n \leq N$, the processor deduces an estimated value or predictor of the value of the potential of each node at the following time $T_{n+1}$ from the potential calculated at time $T_n$, said predictor being used for initializing the iterative calculation of the potential of said node at the following time $T_{n+1}$.

This prediction of the value of the potential in each node at the following time is of interest because, on the one hand, it is substantially free in calculating time in sense that there is no differential equation to be solved for the purpose of obtaining this predictor and, on the other hand, it constitutes an initialization of the iterative calculation of the potential of each node at the following time, so that it makes it possible to reduce the number of iterations by one unit compared with the prior art described relative to FIG. 1. The value of the potential of each node is thus obtained on average in two iterations instead of three as in the prior art, so that there is an approximately 33% calculation time gain.

In a preferred manner, the simulation system is characterized in that the nodes of an electronic circuit to be constructed are sequenced according to the dates at which they receive a signal propagating in said circuit and emitted by a predetermined node, the processor calculating the potential of the nodes in this order.

The sequencing of the nodes has the effect of bringing about faster convergence of the potential values calculated by iteration. This sequencing remains an option in the simulation system according to the invention. It is important to note that the calculated potential values are identical in the simulation system according to the invention, no matter whether or not the nodes are sequenced.

BRIEF DESCRIPTION OF THE DRAWINGS

The invention is described in greater detail hereinafter relative to non-limitative embodiments and with reference to the attached drawings, wherein show:

FIG. 5b, in detail an adder of the circuit of 5a.

DETAILED DESCRIPTION OF THE PREFERRED EMBODIMENTS

Figure 1:
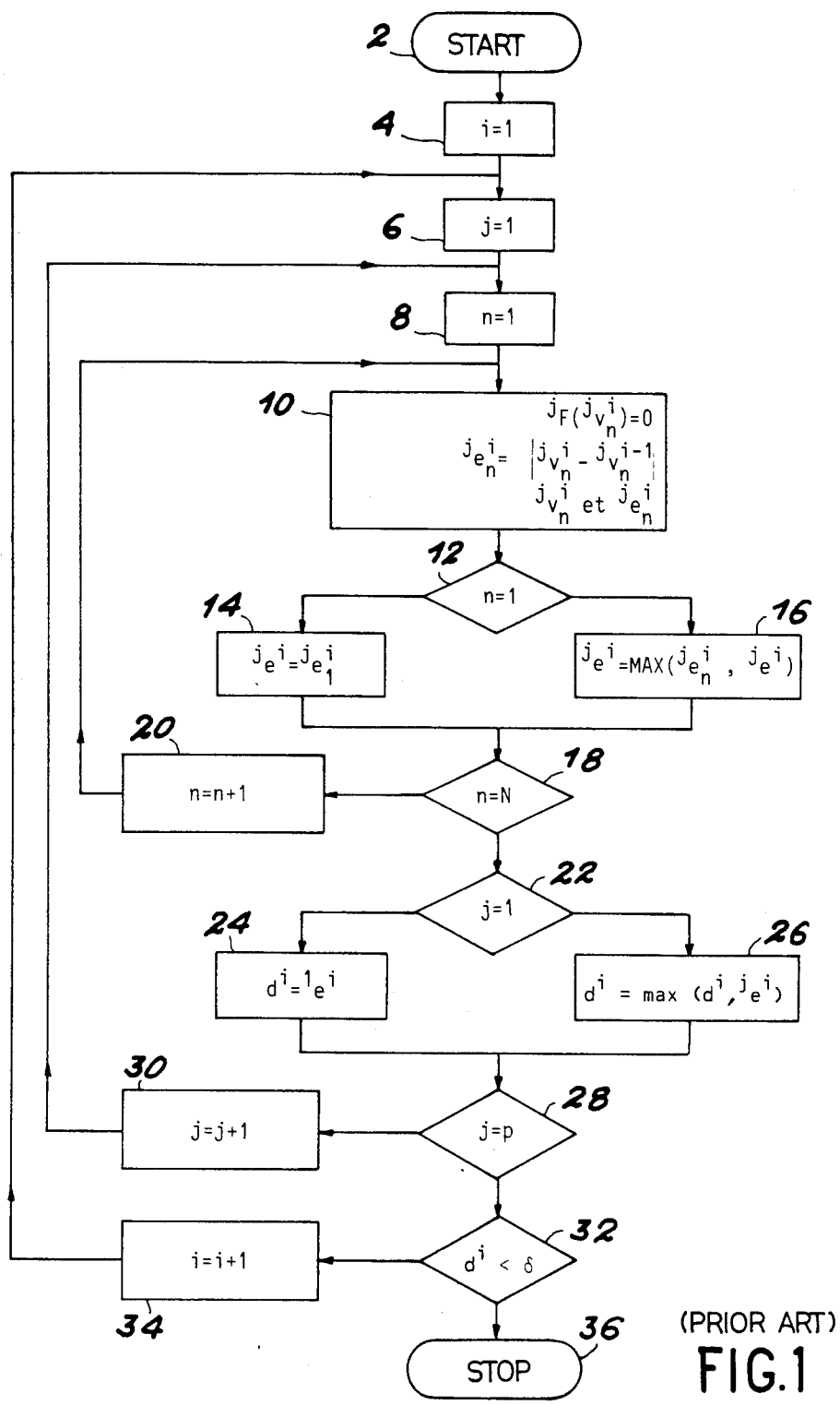
FIG. 1, already described, the flow chart corresponding to the known wave relaxation solving method.

A description will now be given of the resolution used in the simulation system according to the invention with the reference to the flow chart of FIG. 2. The latter has rectangular and diamond-shaped boxes whose significance is the same as those in FIG. 2.

The processing consists of the following propositions or interrogations:
48: the node index j is equal to 1,
56: the node index j is equal to p,
58: the variable $d_n^i$ is below a given threshold,
64: the time index n is equal to N.

Processing also comprises the following operations:
40: initialization of the time index n at 1,
42: initialization of the iteration index i at 1,
44: initialization of the node index j at 1,
46: resolution of $^jE(^jv_n^i)=0$, calculation of $^je_n^i = |^jv_n^i - ^jv_n^{i-1}|$ storage of $^jv_n^i$ and $^je_n^i$,
50: allocation of the value $^1e_n^i$ to the variable $d_n^i$,
52: allocation of the largest of the values between $^je_n^i$ and $d_n^i$ to the variable $d_n^i$,
54: incrementation of the node index j,
60: incrementation of the iteration index i, erasing of $^jv_n^i$ for $1 \leq j \leq p$,
62: evaluation of the predictors $^jv_{n+1}^0$ for $1 \leq j \leq p$,
66: incremention of the time index n.

The flow chart also comprises two declaration operations designated 38 and 68 and respectively corresponding to the beginning and end of processing.

A detailed description will now be given of the processing performed by the simulation system according to the invention, which consists, for node j, where $1 \leq j \leq p$, of solving an implicit equation linking the potential of said node with the potential of the other nodes of the graph representing the simulated electronic circuit.

The differential equation used for describing the evolution of the potential of a node of the graph is not linked with the simulation system according to the invention. Numerous representation models can be used, such as the aforementioned trapezium or GEAR models. As an illustrative example, a description will be given of the processing performed by the simulation system according to the invention using the reverse, first order Euler integration model, which can be represented by the equation $V = F(V,t)$, in which V is a vector, whose components are the potentials of each node of the graph and V is a vector, whose components are first derivatives of said potentials.

In a conventional manner, with the graph representing the electronic circuit to be simulated are associated a sequence of nodes of said graph. These nodes are classified in the order in which they receive a signal propagating in the graph and emitted from a particular node. This node sequencing method makes it possible to simplify the calculations for solving the differential equation describing the graph, without limiting the accuracy of these calculations. It is assumed that the index j classifies the nodes in this sequence. With this sequence and by replacing the continuous derivative V by a discreet increase, the reverse Euler integration equation can be replaced by the j equations:

$$^jv_n^i = {^jv_{n-1}^i} + \Delta t \cdot {^jF(^1v_n^i, \ldots, {^jv_n^i}, {^{j+1}v_n^{i-1}}, \ldots, {^pv_n^{i-1}})}$$

In which $^jF$ designates the jth component of F, $1 < j < p$ and $\Delta t$ is the duration between times $T_{n-1}$ and $T_n$.

The processing performed by the simulation system according to the invention consists, for a fixed time $T_n$, in which $1 \leq n \leq N$, of calculating a first value (i=1) of the potential of each node $j(1 \leq j \leq p)$ of the graph representing the simulated electronic circuit. This first value is calculated for each of the nodes j with the aid of the preceding expression.

It should be noted that during the calculation of the first value of a potential (i=1), the calculation of the value of the potential of the j node involves the values of the potentials of nodes lower than j calculated during the same iteration and values of potentials of nodes higher obtained during the preceding iteration.

However, during the first iteration for node j, the potentials of the nodes with an index higher than j are not yet calculated. For these nodes, use is then made of a potential value calculated in a different way, which will be defined hereinafter. The potentials of these nodes are represented by an iteration index equal to zero.

When a first potential value is obtained for each of the nodes of the graph by a first iteration, one or more other iterations can be realized. These iteration are continued until each of the p sequences $(^jv_n^i)_{i \geq 1}$ converges. The convergence is said to be reached when the difference between the last two terms of each of the p sequences is below a given threshold $\delta$.

Figure 2:
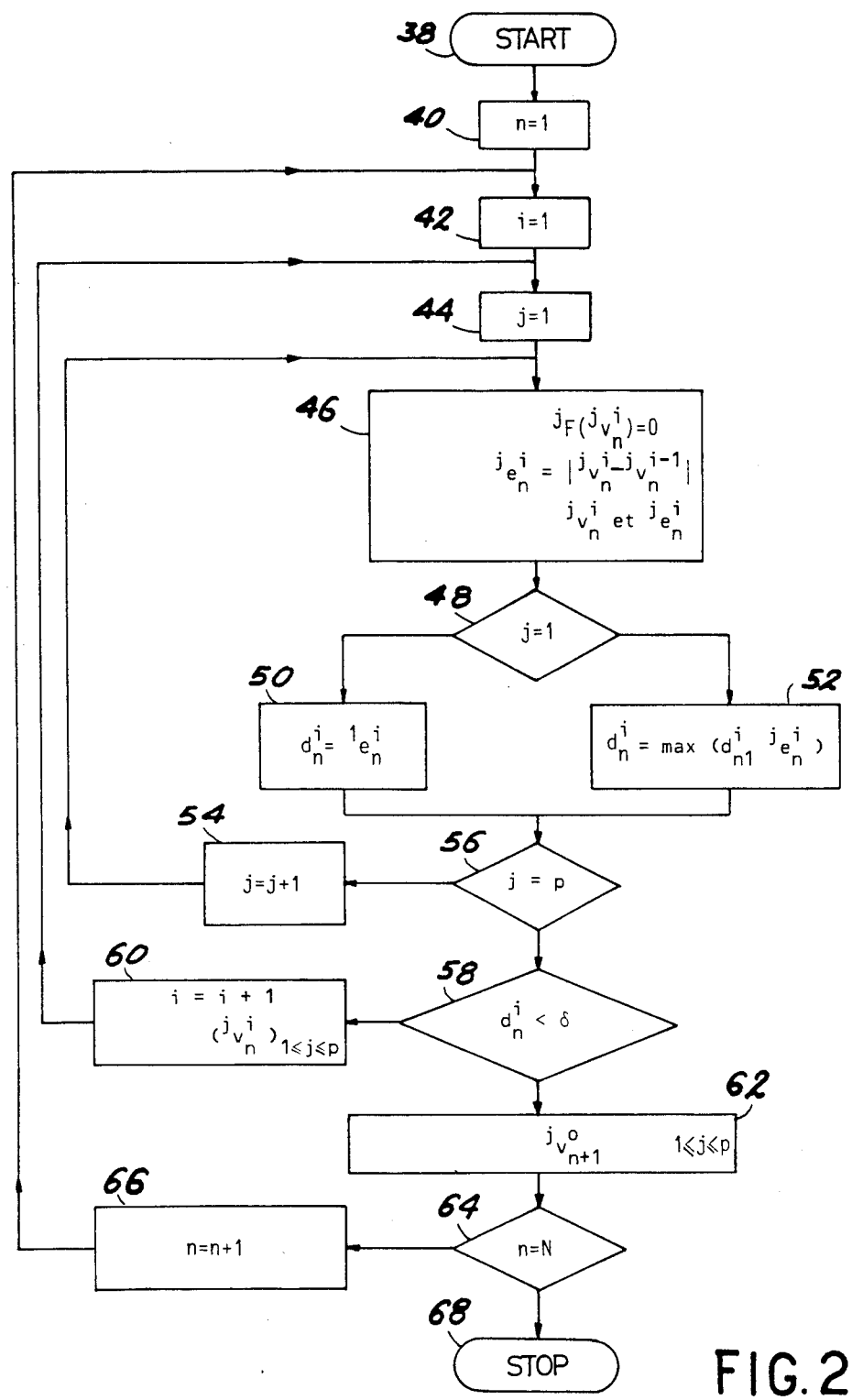
FIG. 2, the flow chart corresponding to the resolution method according to the invention.

In the flow chart of FIG. 2, convergence is obtained for operation 46, in which calculation takes place of the error term $^je_n^i$ equal to the difference between the potential values of node j, at time $T_n$, given by the last two iterations. It is also obtained in operations 50 and 52, which determines the maximum error $d_n^i$ in the sequence $(^je_n^i)_{1 \leq j \leq n}$, and in the proposition 56, which compares said error d with the given threshold $\delta$.

If proposition 58 is true, the p values obtained during the final iteration constitute the values of the potentials of the p nodes of the graph at time $T_n$. If proposition 58 is false, a new iteration is controlled by operation 60.

It should be noted that for each time $T_n$, the number of potential values stored at each iteration i is equal to p. To check the convergence of the p potential values at a given time, it is merely necessary to keep in the memory the potential values of the last two iterations, i.e. $2 \times p$ values.

As will be shown in the remainder of the description, the potential values obtained at a time $T_n$ are used for initializing the calculation of the potentials at the following time $T_{n+1}$. When this initialization stage has been performed, the p potential values calculated at time $T_n$ are no longer used by the simulation system. Thus, these values can be advantageously stored in a secondary memory of the simulation system and can be erased from the central memory (operation 60).

Thus, at all times the number of potential values stored in the central memory of the simulation system does not exceed $2 \times p$ terms. This should be compared with the $2 \times p \times N$ terms which would have to be stored in the simulation system based on the known WRM method.

This requirement of a large memory in the prior art system means that its performance is limited to electronic circuits, whose graph is limited to approximately 50 transistors. This constraint no longer exists with the simulation system according to the invention, whose performance characteristics with regards to the required central memory permit the processing of electronic circuits represented by a graph having roughly 1000 transistors.

According to a preferred embodiment, the simulation system according to the invention can also have increased performance characteristics as a result of the reduction of the calculation time necessary for determining the value of the potentials of the graph nodes. This preferred embodiment corresponds to operation 62 in the flow chart of FIG. 2, which consists of estimating or predicting a potential value of each of the p nodes of the graph at time $T_{n+1}$ as a function of the values calculated at the preceding time $T_n$. The estimated or predicted values produced by this operation are designated $^jv_{n+1}^0$.

This operation 62 is of interest, because the predictors are obtained by solving a simple algebraic equation, which is virtually free as regards calculating time. For each node j, this predictor can be calculated by the expression:

$$^jv_{n+1}^0 = {^jv_n^i} + \Delta t. {^jF({^1v_n^i}, \ldots, {^jv_n^i}, {^{j+1}v_n^{i-1}}, \ldots, {^pv_n^{i-1}})}.$$

Operation 62 is important because, by initializing the potential values for time $T_{n+1}$, it makes it possible to eliminate one iteration. The number of iterations necessary for calculating the value of the potentials of the nodes at a given time is therefore reduced on average to 2 instead of 3 in the known simulation systems. Thus, there is a by no means negligable calculation time decrease.

It is possible to summarize the characteristics of the known processing operation corresponding to the flow chart of FIG. 1 and that according to the invention corresponding to the flow chart of FIG. 2 with the aid of a graph representing the calculations performed.

Figure 3A:
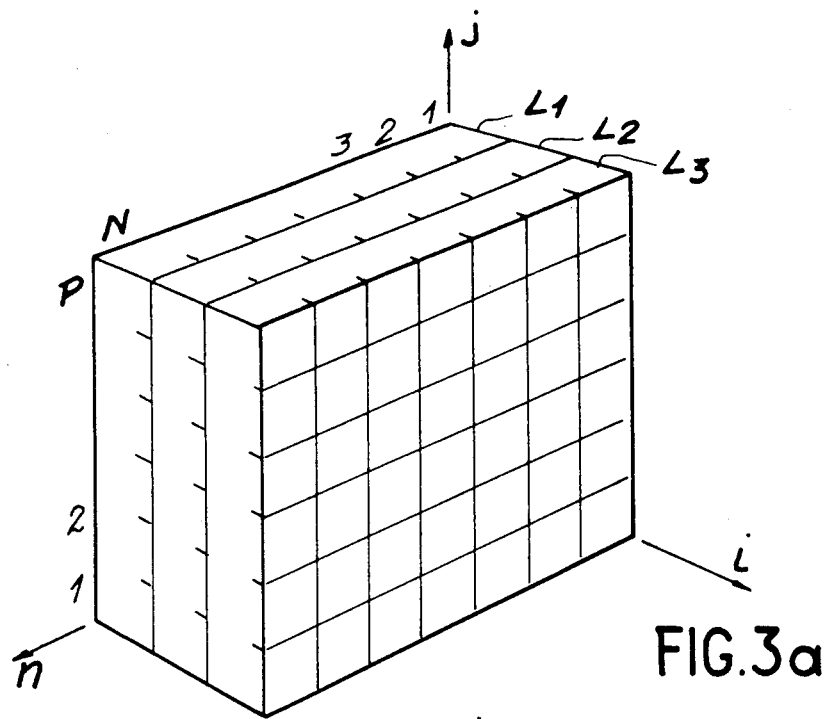
FIGS. 3a and 3b, graphs in space of indexes i, j, n, illustrating the order in which the calculations of the potentials of the nodes are respectively performed in the wave relaxation method described relative to FIG. 1 and the inventive method described relative to FIG. 2.

FIG. 3a shows the case corresponding to the known processing of FIG. 1. This graph has a plurality of parallel rectangles designated by an orthonormalized system of coordinates, whose axes respectively represent the iteration index i, the node index j and the time index n.

The rectangles are parallel to the plane (j,n). The length of the side of each rectangle is equal to p along axis j and to N along axis n. Rectangle $L_1$ represents the p×N potential values calculated during the first iteration (i=1). In the same way, rectangles $L_2$ and $L_3$ respectively correspond to the order 2 and order 3 iterations.

In accordance with the adopted representation, calculations take place rectangle by rectangle. Thus, if for a single potential value, it is necessary to carry out a fourth iteration, said iteration must be carried out of p×N values. It must also be borne in mind that all the calculated potential values must be simultaneously contained in the central memory of the simulation system.

Figure 3B:
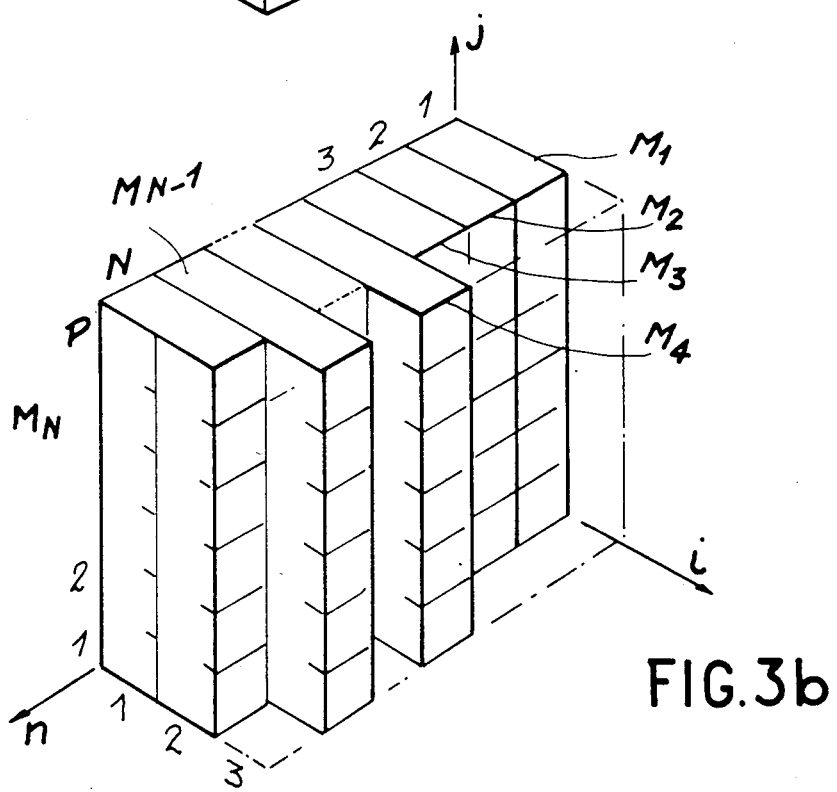

FIG. 3b illustrates the characteristics of the processing operation according to the invention. The calculated potential values are again represented by rectangles $M_1, M_2, \ldots, M_N$, which are parallel to the plane (i,p).

The length of there side along axis is not fixed and is generally equal to 2 or 3; so that the length of there sides along axis j is equal to p. The size of each of the rectangles corresponds to the volume of the calculations performed at each instant $T_n$, $1 \leq n \leq N$.

Comparison of FIGS. 3a and 3b shows that the processing performed according to the invention is much more flexible, because the number of iterations is not fixed and instead varies for each value of the time index n. Moreover, the number of values stored at each time in the central memory of the simulation system according to the invention is at the most equal to 2p. Finally, unlike with the processing according to FIG. 3a in which the potential values for each time n between 1 and N are only available at the end of the calculations, processing according to the invention makes it possible to regularly supply, during the calculations, the values of the potentials of each node during successive times.

Figure 4:
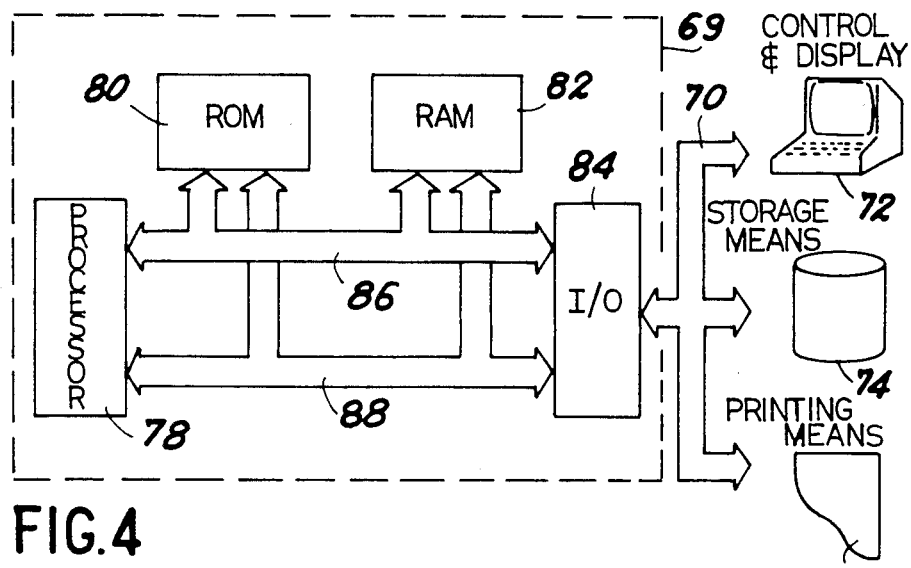
FIG. 4, diagrammatically a simulation system according to the invention.

A description will now be given with reference to FIG. 4 of an embodiment of the simulation system according to the invention. This system comprises a calculating means 69 connected by a bidirectional bus 70 to a control and display means 72, a storage means 74 and printing means 76. In conventional manner, bus 70 comprises data channels, address channels and control channels.

Calculating means 69 comprises a processor 78, a read-only memory 80, a random access memory 82 and an input-output circuit 84. These components are interconnected by a data bus 86 and an address bus 88. The input-output circuit 84 is also connected to bus 70.

The RAM 82 comprises a first zone containing data for representing the simulated electronic circuit, said data being fed in by means of a program contained in ROM 80. The RAM 82 also comprises a calculation zone utilized by processor 78 for carrying out the processing corresponding to the flow chart of FIG. 2. Processing corresponding to said flow chart is represented in the form of a sequence of instructions contained in the ROM 80 which can be performed by processor 78.

Apart from the already stressed advantages of the simulation system with respect to the small memory required, the complexity of the simulatable electronic circuits and the calculation speed, the system according to the invention also has the remarkable characteristic of being able to simulate all types of electronic circuits, which was not the case with the known simulation systems.

Figure 6:
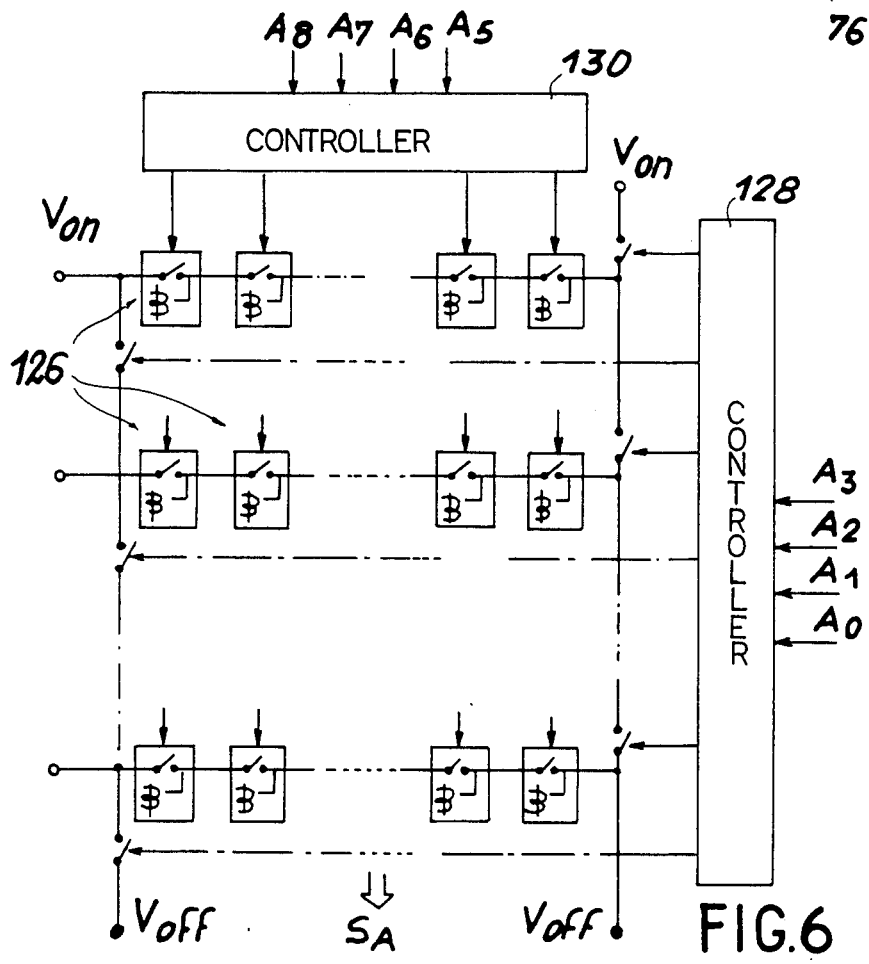
FIG. 6, diagrammatically an analogue—digital converter simulated by the system according to the invention.
Figure 7A:
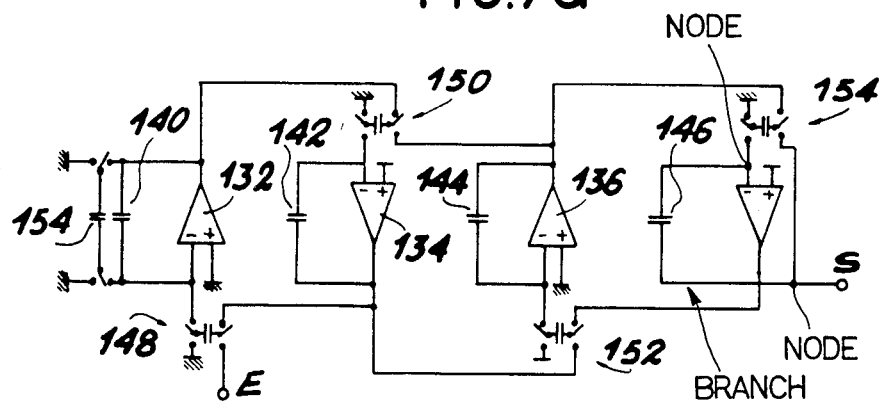
FIG. 7a, diagrammatically a switched capacitance circuit simulated by the system according to the invention.
Figure 7B:
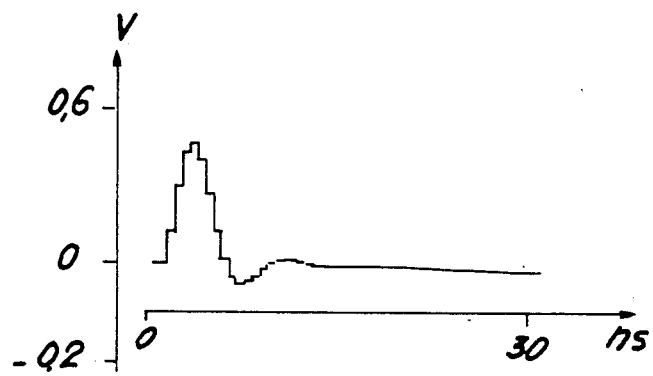
FIG. 7b, the pulse response of the circuit of FIG. 7a calculated by the simulation system according to the invention.

A successive description will now be provided with reference to FIGS. 5 to 7 of a digital circuit, an analogue—digital converter and a switched capacitance circuit simulated by the system according to the invention.

Figure 5A:
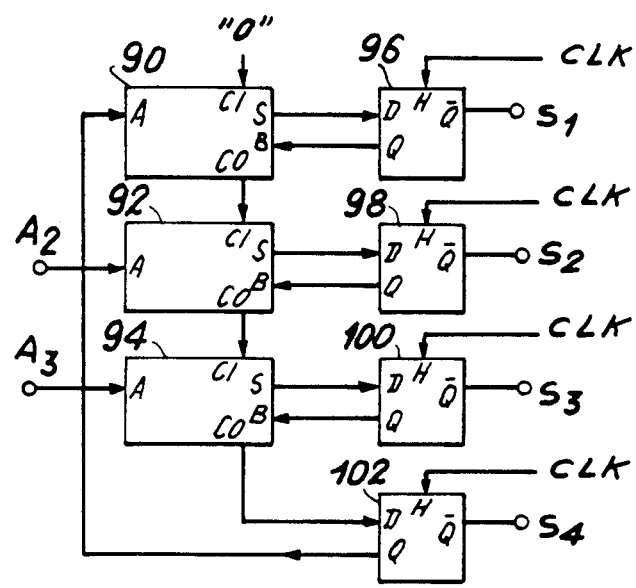
FIG. 5a, diagrammatically a digital circuit simulated by the system according to the invention.

FIG. 5a shows a digital circuit simulated by the simulation system according to the invention. It comprises a loop adder with three elementary adders 90, 92, 94 and four D-type flip-flops 96, 98, 100, and 102.

Each adder comprises an input A, an input B, a carry-over input CI, an output S and a carry-over output CO. With each adder is associated a flip-flop, whose data input B is connected to output S and the non-inverting output Q to input B. The circuit also comprises the following connections: output CO of adder 90 connected to input CI of adder 92, output CO of adder 92 connected to input CI of adder 94, output CO of adder 94 connected to data input D of flip-flop 102. Moreover, input CI of adder 90 receives a low level logic signal. Moreover, the circuit is relooped by connecting the non-inverting output Q of flip-flop 102 to input of adder 90.

The circuit shown in FIG. 5a comprises two inputs $A_2$ and $A_3$ respectively connected to the inputs A of adders 92 and 94 and four outputs $S_1$, $S_2$, $S_3$ and $S_4$ respectively connected to the inverting outputs $\overline{Q}$ of flip-flops 96, 98, 100 and to the non-inverting output Q of flip-flop 102.

Figure 5B:
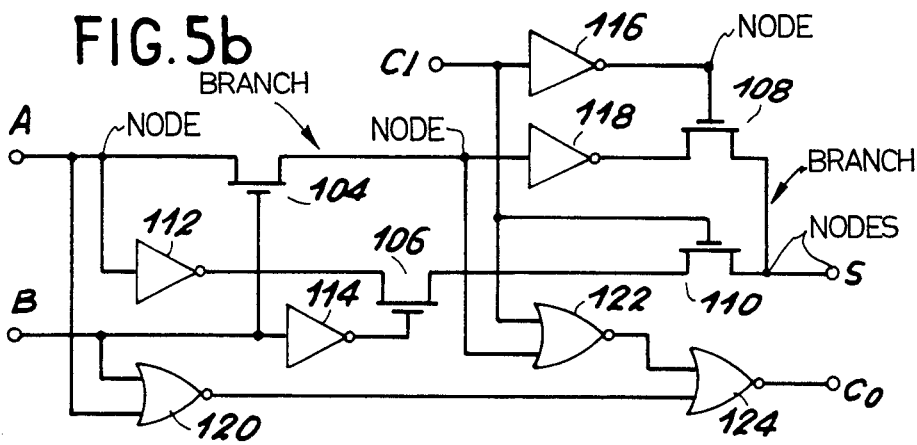

FIG. 5b shows an embodiment of each of the addes 990, 92, and 94. It comprises four MOS transistors 104, 106, 108, 110, four inverters 112, 114, 116, 118 and three NOR gates 120, 122 and 124.

Input A of the adder is connected to the input inverter 112, to the input of gate 120, to the input of inverter 118 by transistor 104 and to an input of gate 122 by said same transistor 104. Input B of the adder is connected to the other input of gate 120, to the input of inverter 114 and to the base of transistor 104. The output of inverter 112 is connected by transistor 106, controlled by the output of inverter 114 and by transistor 110 to the adder output S. The carry-over input CI of the adder is connected to the input of inverter 116, to the base of transistor 110 and to the other input of gate 122. The output of inverter 116 controls the base of transistor 108, which connects the output of inverter 118 to the adder output S. Finally, the inputs of gate 124 are connected to the outputs of gates 120 and 122 and its output is connected to the carry-over output CO.

The looped adder circuit shown in FIG. 5a and whose adders 90, 92, and 94 are illustrated in FIG. 5b is a digital circuit having approximately 150 MOS transistors. It would be difficult to simulate this circuit by a simulation system based on the wave relaxation method due to the large data memory required. However, this constraint disappears with the simulation system according to the invention.

Figure 5C:
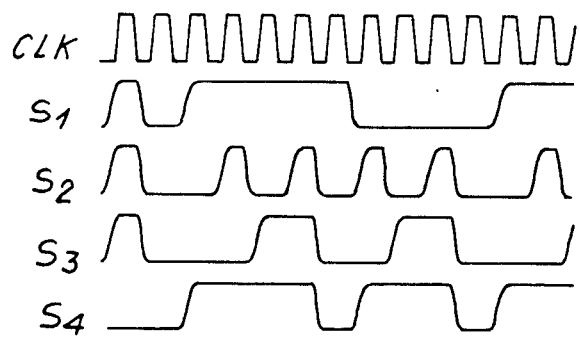
FIG. 5c, a timing diagram of the output signals of FIG. 5a calculated by means of the simulation system according to the invention.

FIG. 5c shows the output signals S1, S2, S3 and S4 of the circuit of FIG. 5a, as a function of the clock signal CLK applied to the flip-flops. The timing chart of FIG. 5c corresponds to a clock frequency of 50 MHz and represents the case where the looped adder inputs A2 and A3 are maintained at a high logic level. Reference is made to the accuracy of the simulation of the value of the signals calculated by the simulation system, which succeeds in reproducing the imperfections in the rising front of the signals when the frequency of the clock signal is high.

For illustrating the performance characteristics of the simulation system according to the invention, the adder circuit of FIG. 5a has been simulated by a simulation system using the aforementioned Newton method. The processing time ratio for an identical simulation performed on the same computer (VAX/VMS 780 of Digital Equipment) is 10 in favour of the simulation system according to the invention.

FIG. 6 shows an 8 bit analogue—digital converter constituting a circuit which is generally difficult to simulate because, like any analogue circuit, it has strong couplings between some nodes. Moreover, the circuit shown in the drawing is particularly complex, because it has 256 cells each containing 6 transistors, i.e. has a complexity of approximately 1600 MOS transistors. The structure of such a converter is of a conventional nature and is more particularly described in the article "THPM 14.6: A 60 ns Glitch-Free NMOS DAC" by V. SHEN and D. HODGES presented at the 1983 International IEEE Conference on Solid State Circuits.

The converter has 256 identical cells 126 organized in a matrix of 16 rows and 16 columns. Switches, formed by MOS transistors, are provided for connecting each cell either to a voltage $V_{on}$ or to a voltage $V_{off}$. In the first case the cell supplies and in the second case it does not supply. The output current of the converter is constituted by the superimposing of current supplied by the supplying cells.

The 8 bits of the digital signal received are divided into a first group of 4 bits used for addressing one row of the matrix and into a second group of 4 bits used for addressing a column of the matrix. The combination of these two addressing signals makes it possible to designate one of the matrix cells. Each of the control means 128 and 130 receives one of the groups of four bits, so as to actuate switches placing in the supplying mode all the cells whose row index is identical to the row index of the designated cell, but whose column is higher, as well as all cells whose row index is higher than the row index of the designated cell.

The simulation system according to the invention has made it possible to simulate this analogue—digital converter by making possible the analysis of the output current establishment time, when the input signal passes from the maximum amplitude to a zero signal, with an accuracy of 0.1%, whilst taking into account the interfering effects due to the incrementation constraints.

FIG. 7a shows a third type of electronic circuit simulated by the simulation system according to the invention. It is a fourth order, low pass, Butterworth filter. The main problem in simulating such a circuit results from the presence of switch capacitances.

The filter shown in FIG. 7a has a conventional structure with four differential amplifiers 132, 134, 136 and 138, each provided with a negative feedback loop constituted by capacitors 140, 142, 144 and 146.

The filter also has switched capacitances arranged in the following way: a switched capacitance 148 between filter input E and the inverting input of amplifier 132, a switched capacitance 150 between the output of amplifier 132 and the inverting input of amplifier 134, a switched capacitance 152 between the output of amplifier 134 and the inverting input of amplifier 136, a switched capacitance 154 between the output of amplifier 136 and the input of inverting amplifier 138 and a switched capacitance 156 in parallel with capacitor 140. Finally, the filter has the connections for connecting the output of an amplifier to the switched capacitance associated with the preceding amplifier, such as amplifier 134 and switched capacitance 148.

The simulation of such a circuit makes it necessary to calculate the potential value of the nodes of the graph associated with said circuit for a very large number of successive time instants. The calculations performed by the simulation system are consequently voluminuous. In order to reduce the volume of the processing, without prejudicing the accuracy of the calculation of the potential of the nodes, use is made of macro models for the operational amplifiers and for the MOS switches. As a result of the block-type calculation method for the linearly coupled nodes and the use of the charge conservation equation in the floating capacitors, the pulse response to this filter was very accurately calculated. This pulse response was obtained in 12 mn CPU time on a Digital Equipment VAX/VMS 780 computer. The transfer function of the fourth order low pass filter was also calculated by using a fast Fourier transform program making it possible to study highly non-linear phenomena of operational amplifiers, such as the limitation of the response time and the finite gain.

Figure 8:
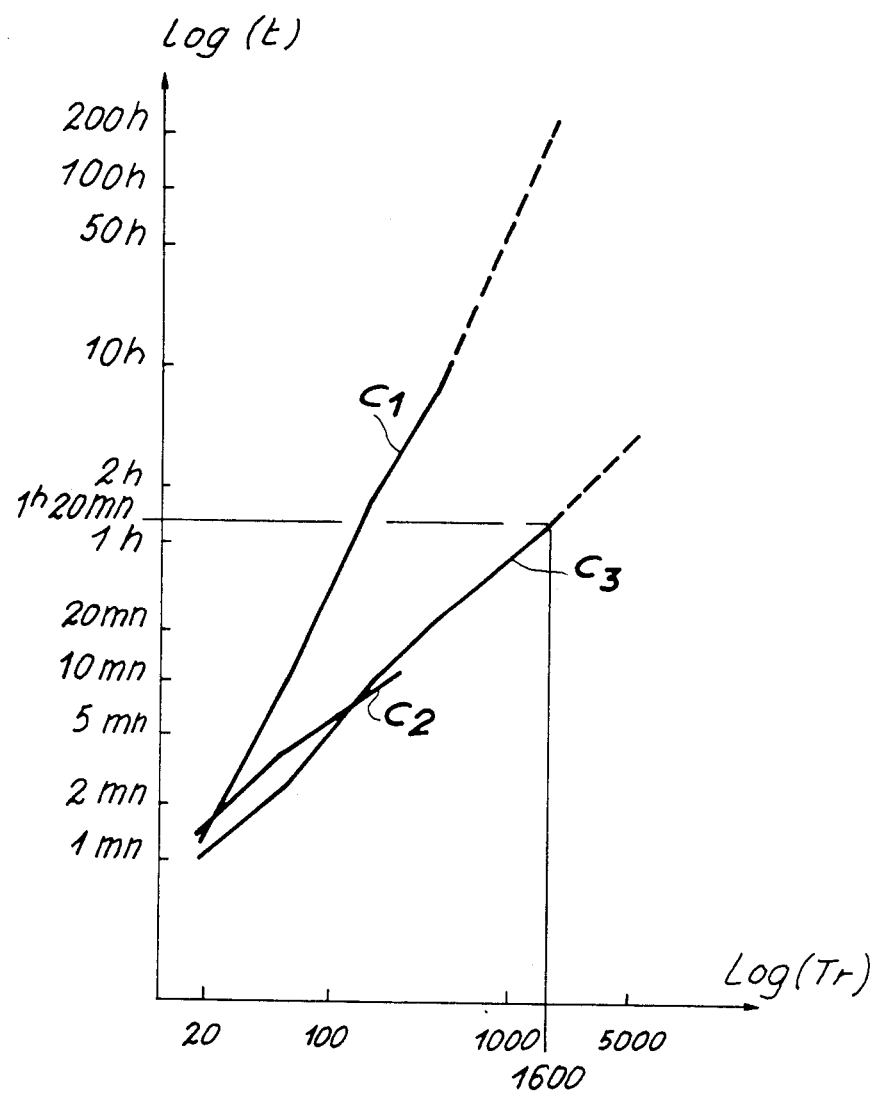
FIG. 8, a graph comparing, for the known simulation systems and for the simulation system according to the invention, the calculation time as a function of the number of transistors of the simulated electronic circuit.

This description will be completed by comparing the performance characteristics of the simulation system according to the invention with two known simulation systems, one using the Newton resolution method and the other using the wave relaxation method. This comparison is illustrated by the graph of FIG. 8 which shows, for each of these simulation systems, a curve indicating the logarithm of the CPU processing time t as a function of the logarithm of the number of transistors Tr of the simulated electronic circuit, said number of transistors being an index representing the complexity of a simulated electronic circuit.

The indicated processing times correspond to a simulation performed on a Digital Equipment VAX/VMS 780 computer. Obviously, this calculation time varies as a function of the information processing equipment used. Thus, all that has to be retained in this graph is the ratio of the calculating times between the simulations performed by two different systems.

Curves C1, C2 and C3 respectively correspond to a simulation performed according to the Newton method, according to the wave relaxation method and according to the method according to the invention. The slope of curves C2 and C3 are roughly equal, the processing time increasing linearly with the complexity of the simulated electronic circuit. However, for the Newton resolution method which consists of inverting the Jacobian matrix of the system of differential equations representing the simulated electronic circuit, the volume of the calculations increases with square of the complexity of the simulated circuit. Thus, the slope of curve C1 is double that of curves C2 and C3, so that the calculation times are prohibitive for simulated electronic circuits having more than roughly 300 transistors.

The wave relaxation method represented by curve C2 has, from the processing time standpoint, performance characteristics comparable to the method according to the invention represented by curve C3 for electronic circuits having a complexity below roughly 300 transistors. However, this complexity of the simulated electronic circuits constitutes a limit for the wave relaxation method on the Digital Equipment VAX/VMS 780 computer. Thus, in order to carry out this simulation, the simulation system using the wave relaxation method employs a 25 Mbyte random-access memory, which saturates the central memory of said computer. For comparison, the simulation system according to the invention only requires a 1 Mbyte RAM for simulating a circuit with 300 transistors.

In conclusion, the advantages of the simulation system according to the invention are summarized by the following points:

calculation speed at least comparable with the fastest known simulation systems for a simulated electronic circuit of given size;

possibility of simulating complex electronic circuits much more rapidly than in known simulation systems;

multi-purpose nature of the simulation system according to the invention, which can simulate both digital circuits and analogue circuits, or switched capacitance circuit, or bipolar circuits, the latter being made possibly with an iterative method using over-and under-relaxation.

What is claimed is:

1. A simulation system of an electronic circuit comprising a memory, a processor, a display means, an interface circuit, and data, address and control buses connecting said memory, processor display means and interface circuit, said memory having a first zone containing data for representing the simulated electronic circuit, a second zone containing instructions and a third calculating zone, said electronic circuit being a network having nodes and branches, each branch having at least one electrical component, the state of said electronic circuit being determined by the potential in each node, the processor performing the instructions contained in said second memory zone, said processor calculating the potential of all the nodes at a fixed time Tn, wherein n is an integer between 1 and N, by solving for each node an implicit equation relative to the potential of said node, by carrying out a series of iterations, calculating, for each node, the difference between the potential calculated for each node after one iteration and the potential of said node obtained after a preceding iteration, comparing said difference with a given threshold, calculating a new iteration if said difference is greater than said threshold, and calculating by the foregoing operations the potential for all the nodes at a further fixed time $T_n$, n having a next integer value until said integer value is equal to N, said display means indicating said potentials at the nodes for use in designing and constructing an actual electronic circuit.

2. A simulation system according to claim 1, in which a sequence of potential values for one node is calculated for a time $T_n$ by an iterative method and in which said sequence does not converge after a predetermined number of iterations and said sequence is monotonic (decreasing or increasing), wherein convergence is speed up by using an over-relaxation method for the further iterations.

3. A simulation system according to claim 1, in which a sequence of potential values for one node is calculated for a time $T_n$ by an iterative method and in which said sequence does not converge after a predetermined number of iterations and said sequence is an oscillatory sequence, wherein convergence is speed up by using an under-relaxation method for the further iterations.

4. A simulation system according to claim 1, wherein for solving the implicit equation relative to the potential of a node, the processor uses the fixed-point method followed by the secant method.

5. A simulation system according to claim 1, wherein, for each fixed time T, $1 \leq n \leq N$, the processor deduces an estimated value or predictor of the potential value of each node at the following time $T_{n+1}$ from the potential calculated at time $T_n$, said predictor being used for initializing the iterative calculation of the potential of said node and the following time $T_{n+1}$.

6. A simulation system according to claim 1, wherein the nodes of the simulated electronic circuit are sequenced in accordance with the dates at which they receive a signal propagating in said circuit and emitted by a predetermined node, the processor calculating the potential of the nodes in said sequence.

* * * * *

UNITED STATES PATENT AND TRADEMARK OFFICE
CERTIFICATE OF CORRECTION

PATENT NO. : 4,791,593

DATED : December 13, 1988

INVENTOR(S) : Bernard Hennion

It is certified that error appears in the above-identified patent and that said Letters Patent is hereby corrected as shown below:

In the Abstract, lines 10 & 11, delete [calculated] and insert --calculate--.

Column 1, line 54, delete [taken] and insert --taking--.

Column 3, line 4, delete [$F(t,\dot{V},\ddot{V},,...)=0$ and insert --$F(t,V,\dot{V},\ddot{V},...)=0$--.

Column 3, line 7, delete [first derivative of $\ddot{V}$ and is] and insert --first derivative of V and $\ddot{V}$ is--.

Column 3, line 8, delete [$F(t,\dot{V},\ddot{V}...)=0$] and insert --$F(t,V,\dot{V},\ddot{V}...)=0$--.

Column 3, line 61, delete [than] and insert --then--.

Column 3, lines 65 & 66, delete [$F(t,V,\dot{V},,...)=0$] and insert --$F(t,V,\dot{V},\ddot{V},...)=0$--.

Column 3, line 66, delete [19] and insert --10--.

Column 4, line 13, delete [in] 2nd occurrence and insert --is--.

Column 4, line 41, delete [T] and insert --$T_n$--.

UNITED STATES PATENT AND TRADEMARK OFFICE
CERTIFICATE OF CORRECTION

PATENT NO. : 4,791,593          PAGE 2 OF 2

DATED : December 13, 1988

INVENTOR(S) : Bernard Hennion

It is certified that error appears in the above-identified patent and that said Letters Patent is hereby corrected as shown below:

Column 7, line 6, delete [$v_n^{i-1}$] and insert --$^j v_n^{i-1}$--.

Column 7, line 35, delete [V] 1st occurrence and insert --$\overset{\bullet}{V}$--.

Column 7, line 37, delete [V] and insert --$\overset{o}{V}$--.

Column 7, line 49, delete [V] and insert --$\overset{o}{V}$--.

Column 9, line 40, delete [of] and insert --for--.

Column 10, line 58, delete [addes] and insert --adders--.

Signed and Sealed this

Second Day of May, 1989

*Attest:*

DONALD J. QUIGG

*Attesting Officer*      *Commissioner of Patents and Trademarks*